United States Patent
Lee et al.

(10) Patent No.: US 8,730,429 B2
(45) Date of Patent: May 20, 2014

(54) MULTI-LAYER PRINTED CIRCUIT BOARD AND LIQUID CRYSTAL DISPLAY DEVICE HAVING THE SAME

(75) Inventors: Yong Kon Lee, Seoul (KR); Jae Ho Lee, Daegu (KR); Yong Seok Kwak, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 250 days.

(21) Appl. No.: 12/950,714

(22) Filed: Nov. 19, 2010

(65) Prior Publication Data
US 2011/0122336 A1 May 26, 2011

(30) Foreign Application Priority Data
Nov. 23, 2009 (KR) ................ 10-2009-00113565

(51) Int. Cl.
*G02F 1/1335* (2006.01)

(52) U.S. Cl.
USPC .............. 349/61; 349/161; 361/748; 361/704

(58) Field of Classification Search
CPC ............ G02B 6/0085; G02F 1/133603; G02F 1/133615; G02F 1/1333; G02F 1/1335; G02F 1/1345; H05K 7/20963; H05K 2201/10106; H05K 2201/09481; H05K 1/00; H05K 1/0203; H05K 1/0204; H05K 1/0206; H05K 1/03; H05K 1/0393; H05K 1/053; H05K 2203/0315; H05K 3/46; H05K 7/20427; H05K 7/20972; H01B 1/22; H01B 1/02

USPC ........ 349/161, 150, 65, 61, 58, 158; 361/748, 361/749, 704, 713, 711, 709; 362/612, 631; 174/252, 250; 257/E23.11
See application file for complete search history.

(56) References Cited

U.S. PATENT DOCUMENTS

| 6,936,855 | B1 * | 8/2005 | Harrah ......................... 257/88 |
| 7,532,479 | B2 * | 5/2009 | Ohno et al. .................. 361/719 |
| 7,922,362 | B2 * | 4/2011 | Lin et al. ...................... 362/294 |
| 7,948,076 | B2 * | 5/2011 | Wang et al. .................. 257/707 |
| 2008/0106911 | A1 * | 5/2008 | Park et al. ..................... 362/612 |
| 2009/0146159 | A1 | 6/2009 | Park et al. |
| 2011/0019126 | A1 * | 1/2011 | Choi et al. ..................... 349/61 |

FOREIGN PATENT DOCUMENTS

| CN | 1837926 A | 9/2006 |
| CN | 201112412 Y | 9/2008 |
| CN | 101290429 A | 10/2008 |
| CN | 101452924 A | 6/2009 |
| JP | 2002-162626 A | 6/2002 |

* cited by examiner

*Primary Examiner* — Thoi Duong
(74) *Attorney, Agent, or Firm* — McKenna, Long & Aldridge, LLP.

(57) ABSTRACT

A PCB and an LCD device with the same are disclosed. The PCB and the LCD device force an LED to directly contact either a heat radiation member or a metal plate. As such, heat generated in the LED is directly transferred to the heat radiation member or the metal plate without passing through wiring and prepreg layers. Therefore, the heat is effectively discharged to the exterior through a bottom cover. In other words, heat generated in the LED can be effectively discharged because of passing through the shortened heat radiation path.

8 Claims, 4 Drawing Sheets

Heat transfer path

Heat transfer path

Heat transfer path

Heat transfer path

# MULTI-LAYER PRINTED CIRCUIT BOARD AND LIQUID CRYSTAL DISPLAY DEVICE HAVING THE SAME

CROSS-REFERENCE TO RELATED APPLICATION

This application claims priority under 35 U.S.C. 119 to Korean Patent Application No. 10-2009-0113565, filed on Nov. 23, 2009, which is hereby incorporated by reference in its entirety.

BACKGROUND

1. Field of the Disclosure

This disclosure relates to a printed circuit board (PCB) and a liquid crystal display (LCD) device with the same, and more particularly to a PCB with superior heat radiation property and to an LCD device including the same.

2. Description of the Related Art

Cathode ray tubes (CRTs), which correspond to one of widely used display devices, are mainly used as monitors for TVs, measuring apparatuses, or information terminals. However, the heavy weight and large size of the CRTs have been a major hindrance to the manufacturing of small, light electronic products.

To address this matter, LCD devices are gradually being used in a wide range of applications due to their advantages such as lightness, thinness, and low power consumption. Accordingly, LCD devices are being manufactured to have even larger screens, be thinner, and consume less power, in order to meet requirements of users. Such LCD devices display images by controlling the amount of light transmitted through liquid crystal.

LCD devices are not self-illuminating display devices, unlike CRTs. As such, an LCD device includes a backlight unit provided on the rear surface of an LCD panel. The backlight unit includes a separated light source providing light necessary to display an image.

The backlight unit can be classified as either an edge type or a direct type in accordance with the disposition of a light source. The edge type backlight unit includes a light source disposed at an inner side surface of it and applies light from the light source to the entire surface of an LCD panel using a light guide plate. On the other hand, the direct type backlight unit includes a plurality of light sources arranged directly under the LCD panel and allows light to be directly applied from the plurality of light sources to the LCD panel.

Recently, the LCD device employs light emission diode (LED) as a light source. Actually, the recent LCD device includes a PCB on which a plurality of LEDs are arranged. The PCB loaded with the plurality of LEDs is used for both the edge and direct type backlight units.

The LED has a serious problem of heat generating phenomenon. This results from the fact that the residual energy not being used in the generation of light is converted into heat. When the heat generated from the LED accumulates into the LCD device without being externally radiated, the LCD device can be deteriorated and decreases its display quality. In addition, if the heat generating phenomenon is continued, durability and reliability of the LED can be deteriorated.

To address this matter, a PCB of the related art is configured to include a copper thin film, a prepreg layer, and a metal layer. In this case, heat generated in LED can be externally radiated through a LED chip, a LED lead frame, the copper thin film of the PCB, the prepreg layer of the PCB, the metal layer of the PCB, and a bottom cover of the LCD device.

However, such a heat radiation path forces heat to pass through many steps. As such, the pregreg layer must function as a critical factor. Therefore, heat radiation characteristic of the LCD device must depend on thermal conductivity of the prepreg layer. More specifically, costs of the LCD device increase as the thermal conductivity of the prepreg layer becomes higher. In view of this point, it is necessary for the PCB and the LCD device to effectively radiate heat generated by the LED toward the exterior.

BRIEF SUMMARY

Accordingly, the present embodiments are directed to a PCB that substantially obviates one or more of problems due to the limitations and disadvantages of the related art, and an LCD device with the same.

An object of the present embodiments is to provide a PCB that is adapted to reduce a heat radiation path by enabling a metal plate to contact an LED through a structural modification, as well as an LCD device with the same.

Another object of the present embodiments is to provide an LCD device that is adapted to effectively radiate heat generated in an LED toward its exterior.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a printed circuit board includes: a metal plate; a wiring layer disposed on the metal plate and configured to include an electrode pattern; a prepreg layer interposed between the metal plate and the wiring layer and configured to insulate the metal plate and the wiring layer; an oxidation prevention layer formed on the wiring layer; and a heat radiation member formed from a heat radiation material which is filled in a hole passing through the oxidation prevention layer, the wiring layer, and the prepreg layer.

A printed circuit board according to another general aspect of the present embodiment, includes: a metal plate configured to include a protrusion portion; a wiring layer formed on the metal plate and configured to include an electrode pattern; a prepreg layer interposed between the metal plate and the wiring layer and configured to insulate the metal plate and the wiring layer; and an oxidation prevention layer formed on the wiring layer.

An LCD device according to still another general aspect of the present embodiment, includes: a metal plate; a wiring layer disposed on the metal plate and configured to include an electrode pattern; a prepreg layer interposed between the metal plate and the wiring layer and configured to insulate the metal plate and the wiring layer; an oxidation prevention layer formed on the wiring layer; a heat radiation member formed from a heat radiation material which is filled in a hole passing through the oxidation prevention layer, the wiring layer, and the prepreg layer; an LED disposed opposite to the heat radiation member; and a bottom cover disposed under the metal plate.

An LCD device according to further still another general aspect of the present embodiment, includes: a metal plate configured to include a protrusion portion; a wiring layer formed on the metal plate and configured to include an electrode pattern; a prepreg layer interposed between the metal plate and the wiring layer and configured to insulate the metal plate and the wiring layer; an oxidation prevention layer formed on the wiring layer; an LED disposed opposite to the protrusion portion; and a bottom cover disposed under the metal plate.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
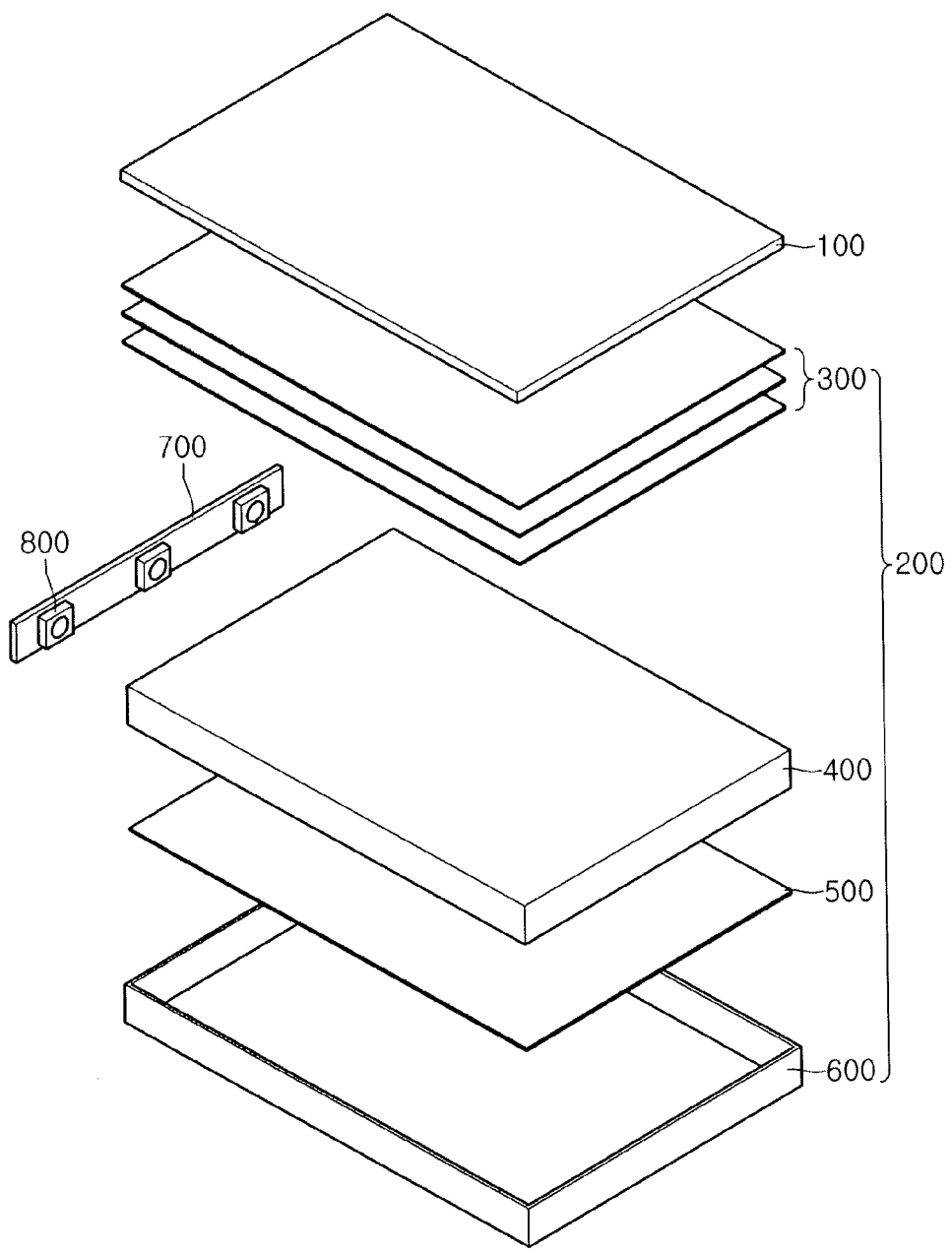
FIG. 1 is a disassembled perspective view showing an LCD device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art.

Therefore, these embodiments might be embodied in a different shape, so are not limited to these embodiments described here. Moreover, it will be understood that when an element, such as a substrate, a layer, a region, a film, or an electrode, is referred to as being formed "on" or "under" another element in the embodiments, it may be directly on or under the other element, or intervening elements (indirectly) may be present. The term "on" or "under" of an element will be determined based on the drawings. In the drawings, the sides of elements can be exaggerated for clarity, but they do not mean the practical sizes of elements.

Figure 2:
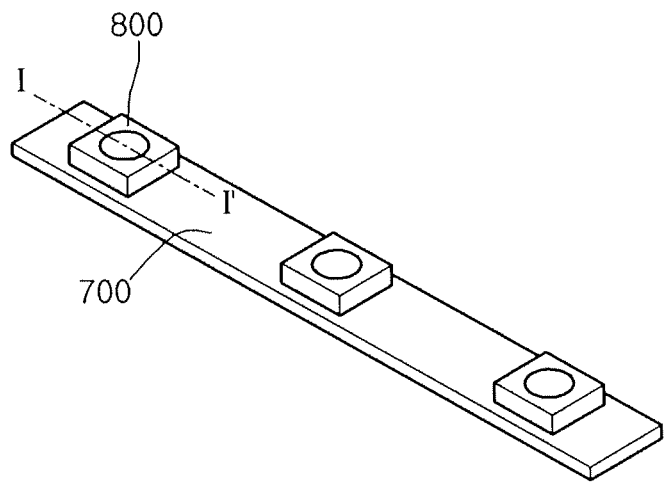
FIG. 2 is a perspective view showing in detail the PCB loaded with the LEDs in FIG. 1.
Figure 3:
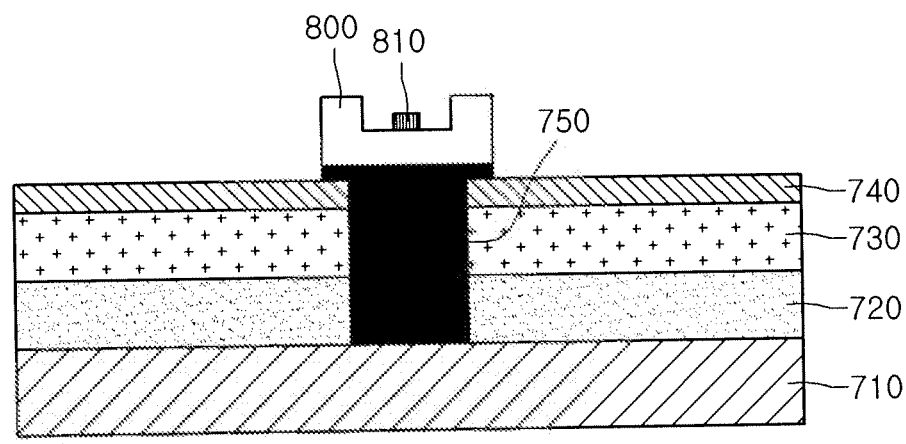
FIG. 3 is a cross-sectional view showing an embodiment of the PCB loaded with the LEDs taken along a line I-I' in FIG. 2.
Figure 4:
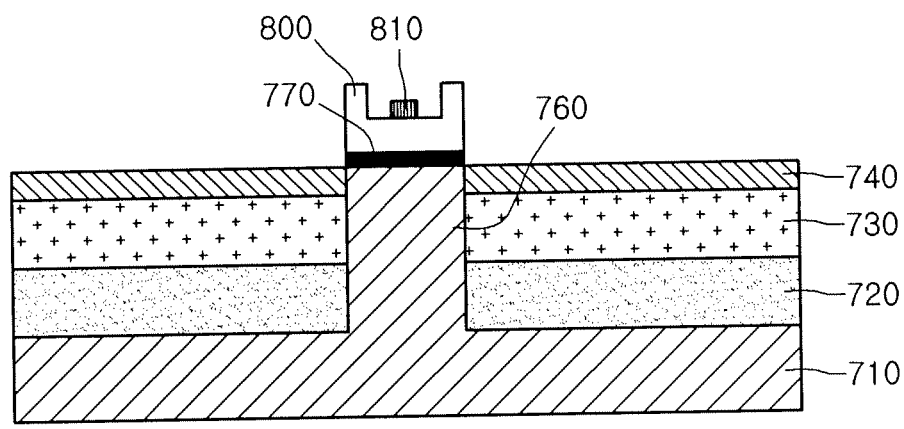
FIG. 4 is a cross-sectional view showing another embodiment of the PCB loaded with the LEDs taken along a line I-I' in FIG. 2.

FIG. 1 is a disassembled perspective view showing an LCD device according to an embodiment of the present disclosure. FIG. 2 is a perspective view showing in detail the PCB loaded with the LEDs in FIG. 1. FIG. 3 is a cross-sectional view showing an embodiment of the PCB loaded with the LEDs taken along a line I-I' in FIG. 2. FIG. 4 is a cross-sectional view showing another embodiment of the PCB loaded with the LEDs taken along a line I-I' in FIG. 2.

Referring to FIG. 1, the LCD device according to an embodiment of the present disclosure includes an LCD panel 100 configured to display images and a backlight unit 200 disposed under the LCD panel 100. The backlight unit 200 is configured to apply light to the LCD panel 100.

Although it is not shown in detail in the drawings, the LCD panel 100 includes a thin film transistor (TFT) substrate and a color filter substrate combined opposite each other, and a liquid crystal layer interposed between the two substrates. A uniform cell gap is maintained between the TFT substrate and the color filter substrate. The TFT substrate includes a plurality of gate lines and a plurality of data lines formed to cross each other, and TFTs formed at the intersections of the gate and data lines. Such an LCD panel 100 displays images using light applied from the backlight unit 200.

The backlight unit 200 includes a light source 800 and a light guide plate 400 disposed parallel to the light source 800. The light guide plate 400 converts incident lights from the light source 800 into two-dimensional light.

The backlight unit 200 further includes optical sheets 300 disposed on the light guide plate 400, and a reflection sheet 500 disposed under the light guide plate 400. The optical sheets 300 scatter and converge light from the light guide plate 400. The reflection sheet 500 reflects light progressing downwardly from the light guide plate 400 toward the LCD panel 100, thereby reducing light loss.

The backlight unit 200 still further includes a box-shaped bottom cover 600 with an opened upper surface. The bottom cover 600 is engaged with a support main (not shown).

The light source 800 is disposed on a side surface of the light guide plate 400. Such a light source 800 can be configured to include either a cold cathode fluorescent lamp (CCFL) or an external electrode fluorescent lamp (EEFL). The CCFL is configured to include electrodes disposed into both end of the lamp. The EEFL is configured to include electrodes encompassing both ends of the lamp. Alternatively, the light source 800 can be configured to include a plurality of LEDs instead of the lamps. The light source 800 of the present embodiments will now be described to include the LED 810.

The light guide plate 400 can be formed from polymethyl methacrylate (PMMA). Although it is not shown in detail in the drawings, the light guide plate 400 can be formed in a wedge shape which becomes thinner the further away it goes from the incident surface. Also, the light guide plate 400 can include a prism pattern formed on its rear surface and configured to refract incident light toward the optical sheets 300. Such a light guide plate 400 has functions to convert linear light or spotted lights into two-dimensional light and to guide incident light from the light source 800 toward the LCD panel 100.

A part of incident light into the light guide plate 400 is output in a downward direction of the light guide plate 400. In this case, the reflection sheet 500 disposed under the light guide plate 400 reflects the downwardly output light from the light guide plate 400 toward the light guide plate 400 and the optical sheet 300. To this end, the reflection sheet 500 may be formed from a high reflective material such as PET or others.

The optical sheets 300 includes a diffusion sheet configured to scatter light, a converging sheet configured to converge light, and a protective sheet configured to protect the converging sheet. The diffusion sheet, the converging sheet, and the protective sheet are sequentially stacked on the light guide plate 400.

The bottom cover 600 with a structure of the opened upper surface is used for protecting the backlight unit 200 (more specifically, components thereof). Also, the bottom cover 600 is formed from a metal material, in order to reinforce the strength of the backlight unit 200. Furthermore, the bottom cover 600 functions to finally radiate heat generated in the LEDs 810 of the light source 800 to the exterior through it.

Referring to FIGS. 2 through 4, the PCB 700 loaded with the light source 800 includes a metal plate 710, a prepreg layer 720, a wiring layer 730, and an oxidation protection layer 740.

The metal plate 710 can be formed from aluminum, but it is not limited to this. The metal plate 710 must have superior heat conductivity. Therefore, the metal plate 710 can be formed from any thermal conductivity material superior enough to effectively discharge heat toward the bottom cover 600 through it.

The prepreg layer 720 is formed on the metal plate 710. The prepreg layer 720 is used to insulate the metal plate 710 and the wiring layer 730. Also, the prepreg layer 720 has the most important function in the discharge of heat generated in the LED 810 of the light source 800. In other words, the prepreg layer 720 must effectively transfer heat generated in the LED 810 of the light source 800 to the metal plate 710, even though it is used as an insulation layer.

Actually, the heat radiation characteristic of the related art PCB largely depends on the thermal conductivity of the prepreg layer 720. As such, manufacturing costs of the related art PCB increases as the conductivity of the prepreg layer 720 becomes higher. Such a prepreg layer 720 can be formed from one material selected from a material group of epoxy-based materials and ceramic filler materials.

However, the PCB 700 of the present embodiments are configured to directly transfer heat generated in the light source 800 (more specifically, in the LED 810) to the metal plate 710 without conducting the heat to the prepreg layer 720, as described below. As such, the PCBs of the present embodiments can effectively discharge heat generated in the LED 810 to the exterior regardless of the prepreg layer 720.

The wiring layer 730 is formed on the prepreg layer 720. The wiring layer 730 is further formed to include an electrode pattern. As such, the wiring layer 730 is formed from copper. Such a wiring layer 730 transfers heat generated in the LED 810 to the prepreg layer 720, in order to discharge the heat to the exterior.

The oxidation protection layer 740 is formed on the wiring layer 730. The oxidation protection layer 740 is used to prevent the oxidation of the wiring layer 730. Such an oxidation prevention layer 740 can be changed according to the shape of the wiring layer 730.

The PCB 700 according to an embodiment of the present disclosure can further include a heat radiation member 750 formed in a hole (not shown), as shown in FIG. 3. The hole is formed to pass through the oxidation prevention layer 740, wiring layer 730, and prepreg layer 720 and to expose a part of the metal plate 710. The heat radiation member 750 is formed by filling a heat radiation material in the hole.

The hole penetrating through the oxidation prevention layer 740, the wiring layer 730, and the prepreg layer 720 can be formed by punching parts of the oxidation prevent layer 740, wiring layer 730, and prepreg layer which correspond to the hole (not shown), and then by combining the punched layers 740, 730, and 720 with the metal plate 710 using a hot presser. Alternatively, the hole can be formed by etching parts of the oxidation prevention layer 740, wiring layer 730, and prepreg layer 720 opposite to it, without the metal plate 710.

The heat radiation member 750 directly transfers heat generated in the LED 810 to the metal plate 710. As such, a heat radiation material forming the heat radiation member 750 must have a superior thermal conductivity. Such a heat radiation material can be lead Pb, it is not limited to this. In other words, any one of superior thermal conductivity materials can be used to form the heat radiation member 750.

The light source 800 (more specifically, LED 810) is disposed on the heat radiation member 750. In accordance therewith, heat generated in the LED 810 of the light source 800 is directly transferred to the heat radiation member 750. Then, the heat radiation member 750 delivers the transferred heat to the metal plate 710. Therefore, the generated heat from the LED 810 of the light source 800 can be effectively discharged to the exterior.

The PCB 700 according to another embodiment of the present disclosure includes a metal plate 710 provided with a protrusion portion 760, as shown in FIG. 4. The protrusion portion 760 can be formed in a single body united with the metal plate 710. A prepreg layer 720, a wiring layer 730, and an oxidation prevention layer 740 are sequentially stacked on the metal plate 710 without the protrusion portion 760. In other words, the prepreg layer 720, wiring layer 730, and oxidation prevention layer 740 are formed in contact with all the side surface of the protrusion portion 760, as shown in FIG. 4. As such, the metal plate 710 is formed from the same material as the protrusion portion 760. The metal plate 710 and the protrusion portion 760 can be formed from aluminum (Al), but it is not limited to this.

The protrusion portion 760 on the metal plate 710 can be formed by coating a mask material on a region of the metal plate 710 where the protrusion portion 760 is positioned, and then by etching the metal plate 710 by a desired thickness using the mask material as an etching mask.

The light source 800 with the LED 810 is disposed on the protrusion portion 760. More specifically, a solder cream 770 is first plastered on the protrusion portion 760 and then the light source 800 with the LED 810 is attached to the plastered solder cream 770. As such, heat generated in the LED 810 of the light source 800 is directly transferred to the protrusion portion 760. The transferred heat can be effectively discharged to the exterior because the protrusion portion 760 has a superior thermal conductivity.

Consequently, the heat radiation member 750 included an embodiment of the PCB 700 and the protrusion portion 760 included another embodiment of the PCB 700 are all formed from the superior thermal conductivity material. Therefore, the PCBs 700 of the present embodiments can force heat generated in the LED 810 of the light source 800 to be more effectively discharged to the exterior.

Figure 5:
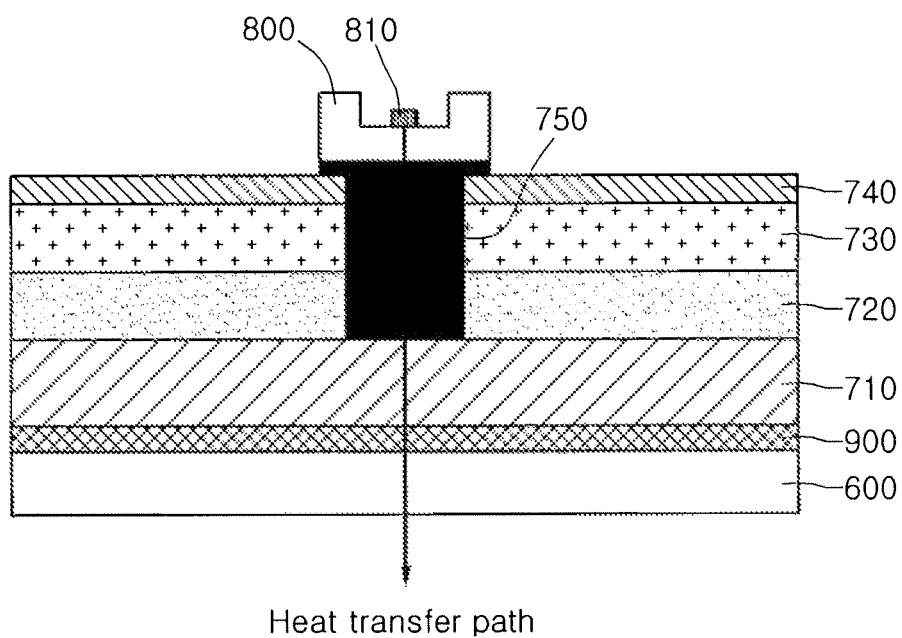
FIG. 5 is a cross-sectional view illustrating a part of the LCD device including a heat radiation path and the PCB which is loaded with the LEDs as shown in FIG. 3 and attached to a bottom cover.
Figure 6:
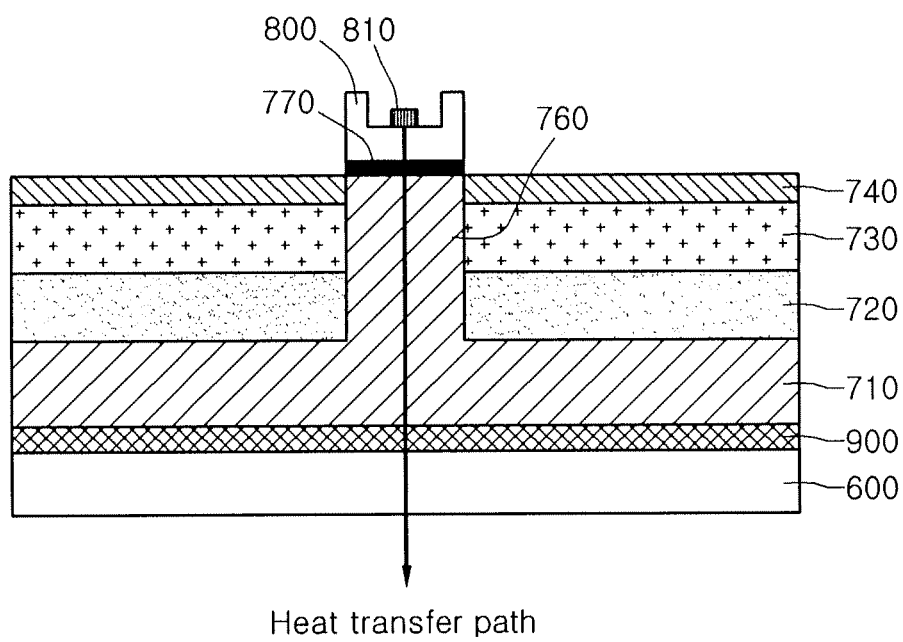
FIG. 6 is a cross-sectional view illustrating a part of the LCD device including a heat radiation path and the PCB which is loaded with the LEDs as shown in FIG. 4 and attached to a bottom cover.

FIG. 5 is a cross-sectional view illustrating a part of the LCD device including a heat radiation path and the PCB which is loaded with the LEDs as shown in FIG. 3 and attached to a bottom cover. FIG. 6 is a cross-sectional view illustrating a part of the LCD device including a heat radiation path and the PCB which is loaded with the LEDs as shown in FIG. 4 and attached to a bottom cover.

Referring to FIGS. 5 and 6, the metal plate 710 is disposed opposite the bottom cover 600 in the center of a heat radiation pad 900. As such, heat generated in the LED 810 is directly transferred to the bottom cover 600 via the heat radiation member 750 and the metal plate 710, and discharged to the exterior, as shown in FIG. 5. Alternatively, heat generated in the LED 810 is directly transferred to the bottom cover 600 via the protrusion portion 760 and the metal plate 710, and discharged to the exterior, as shown in FIG. 6.

As described above, the PCBs 700 of the present embodiments allow heat generated in the LED 810 not to pass through the wiring layer 730 and the prepreg layer 720. The PCBs 700 can more effectively discharge heat to the exterior through a shortened head radiation path in comparison with that of the related art. In addition, the PCBs 700 and the LCD device according to the present embodiments can cut down the costs for the prepreg layer 720 as heat generated in the LED 810 does not pass through the prepreg layer 720.

Moreover, as the heat radiation effect increases, the temperature in the junction portion of the LED 810 can be lowered. Therefore, the life span of the LED 810 can be lengthened, and additional radiation components can be removed.

Although embodiments have been described with reference to a number of illustrative embodiments thereof, this disclosure is not limited to those. In other words, this disclosure is presented as an example. Also, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. Therefore, variations and modifications in the component parts and/or arrangements, alternative uses must be regarded as included in the appended claims.

What is claimed is:

1. A printed circuit board comprising:
a metal plate;
a wiring layer disposed on the metal plate and configured to include an electrode pattern;
a prepreg layer interposed between the metal plate and layer and configured to insulate the metal plate and the wiring layer;
an oxidation prevention layer formed on the wiring layer; and
a heat radiation member formed from a heat radiation material which is filled in a hole passing through the oxidation prevention layer, the wiring layer, and the prepreg layer, and formed on the metal plate,
wherein the heat radiation member directly transfers heat to the metal plate.

2. The printed circuit board claimed as claim 1, wherein the heat radiation material includes lead (Pb).

3. A liquid crystal display device comprising:
a metal plate;
a wiring layer disposed on the metal plate and configured to include an electrode pattern;
a prepreg layer interposed between the metal plate and the wiring layer and configured to insulate the metal plate and the wiring layer;
an oxidation prevention layer formed on the wiring layer;
a heat radiation member formed directly on and above the metal plate from a heat radiation material which is filled in a hole passing through the oxidation prevention layer, the wiring layer, and the prepreg layer;
an LED disposed opposite to the heat radiation member; and
a bottom cover disposed under the metal plate and having a heat radiation pad,
wherein the metal plate is directly in contact with the heat radiation pad of the bottom cover such that heat generated from the LED is discharged from the heat radiation member directly to the metal plate and then to the bottom cover through the heat radiation pad.

4. The liquid crystal display device claimed as claim 3, wherein the LED is disposed to contact the heat radiation member.

5. The liquid crystal display device claimed as claim 3, wherein the prepreg layer is formed from one material selected from a group of epoxy-based materials and ceramic filter materials.

6. A liquid crystal display device comprising:
a metal plate configured to include a protrusion portion;
a solder cream formed on the protrusion portion;
a wiring layer formed on the metal plate and configured to include an electrode pattern;
a prepreg layer interposed between the metal plate and the wiring layer and configured to insulate the metal plate and the wiring layer;
an oxidation prevention layer formed on the wiring layer;
an LED disposed opposite to the protrusion portion; and
a bottom cover disposed under the metal plate and having a heat radiation pad,
wherein the prepreg layer, wiring layer and oxidation prevention layer are formed in contact with all the side surface of the protrusion portion, and
wherein the metal plate is directly in contact with the heat radiation pad of the bottom cover such that heat generated from the LED is discharged from the solder cream to the bottom cover through the metal plate having the protrusion portion and the heat radiation pad.

7. The liquid crystal display device claimed as claim 6, wherein the prepreg layer is formed from one material selected from a group of epoxy-based materials and ceramic filter materials.

8. A liquid crystal display device comprising:
a metal plate;
a wiring layer disposed on the metal plate and configured to include an electrode pattern;
a prepreg layer interposed between the metal plate and the wiring layer and configured to insulate the metal plate and the wiring layer;
an oxidation prevention layer formed on the wiring layer; and
a heat radiation member formed from a heat radiation material which is filled in a hole passing through the oxidation prevention layer, the wiring layer, the prepreg layer, and formed on the metal plate,
wherein the heat radiation member directly transfers heat to the metal plate,
an LED disposed opposite to the heat radiation member; and
a bottom cover disposed under the metal plate.

* * * * *